(12) United States Patent
Cassel

(10) Patent No.: US 7,301,250 B2
(45) Date of Patent: Nov. 27, 2007

(54) HIGH VOLTAGE PULSED POWER SUPPLY USING SOLID STATE SWITCHES

(75) Inventor: Richard L. Cassel, Palo Alto, CA (US)

(73) Assignee: Stangenes Industries, Inc., Palo Alto, CA (US)

( * ) Notice: Subject to any disclaimer, the term of this patent is extended or adjusted under 35 U.S.C. 154(b) by 343 days.

(21) Appl. No.: 10/838,600

(22) Filed: May 4, 2004

(65) Prior Publication Data

US 2005/0248216 A1 Nov. 10, 2005

(51) Int. Cl.
 H03K 3/64 (2006.01)
 H02M 3/18 (2006.01)

(52) U.S. Cl. .................. 307/106; 307/110; 307/108

(58) Field of Classification Search .............. 307/108, 307/110, 106
See application file for complete search history.

(56) References Cited

U.S. PATENT DOCUMENTS

| | | | | |
|---|---|---|---|---|
| 3,343,007 A | * | 9/1967 | Massey | 307/108 |
| 4,011,463 A | * | 3/1977 | Fasching | 307/110 |
| 4,105,952 A | | 8/1978 | Tulip | |
| 4,375,594 A | * | 3/1983 | Ewanizky, Jr. | 307/110 |
| 4,645,941 A | | 2/1987 | Nicolas | |
| 4,680,671 A | | 7/1987 | Brion et al. | |
| 4,704,543 A | * | 11/1987 | Barker et al. | 307/106 |
| 5,245,253 A | | 9/1993 | Quazi | |
| 5,311,067 A | | 5/1994 | Grothaus et al. | |
| 5,365,421 A | * | 11/1994 | Eastman | 363/71 |
| 5,391,998 A | * | 2/1995 | Symons | 327/181 |
| 5,905,371 A | | 5/1999 | Limpaecher | |
| 6,060,791 A | | 5/2000 | Goerz et al. | |
| 6,066,901 A | * | 5/2000 | Burkhart et al. | 307/106 |
| 6,078,110 A | | 6/2000 | Zakharian | |
| 6,166,459 A | | 12/2000 | Holland et al. | |

(Continued)

FOREIGN PATENT DOCUMENTS

JP 56-110282 9/1981

(Continued)

OTHER PUBLICATIONS

D. Sprehn et al, X-Band klystron development at the Stanford Linear Accelerator Center, SLAC-PUB-8346, Mar. 2000.

(Continued)

*Primary Examiner*—Michael Sherry
*Assistant Examiner*—Michael Rutland-Wallis
(74) *Attorney, Agent, or Firm*—Workman Nydegger

(57) ABSTRACT

Systems and methods for generating a high voltage pulse. A series of voltage cells are connected such that charging capacitors can be charged in parallel and discharged in series. Each cell includes a main switch and a return switch. When the main switches are turned on, the capacitors in the cells are in series and discharge. When the main switches are turned off and the return switches are turned on, the capacitors charge in parallel. One or more of the cells can be inactive without preventing a pulse from being generated. The amplitude, duration, rise time, and fall time can be controlled with the voltage cells. Each voltage cell also includes a balance network to match the stray capacitance seen by each voltage cell.

26 Claims, 7 Drawing Sheets

U.S. PATENT DOCUMENTS

| | | |
|---|---|---|
| 6,205,200 B1 | 3/2001 | Boyer et al. |
| 6,831,377 B2 * | 12/2004 | Yampolsky et al. ........ 307/106 |
| 2002/0105773 A1 | 8/2002 | Seely et al. |
| 2003/0016711 A1 | 1/2003 | Crawford |

FOREIGN PATENT DOCUMENTS

| | | |
|---|---|---|
| JP | 01066985 A | 3/1989 |
| JP | 10-177051 | 6/1998 |

OTHER PUBLICATIONS

R. Koontz et al, NLC Klystron Pulse Modulator R&D at SLAC, 1998 IEEE.

R. Cassel et al, Solid State Induction Modulator replacement for SLAC Klystron Modulators, 24th International Power Modulator Symposium, Norfolk, VA, Jun. 2000.

M. Gaudreau et al, Solid-State Pulsed Power Systems, 23rd International Power Modulator Symposium, Rancho Mirage, CA, Jun. 1998.

G. Caryotakis et al, The Next Linear Collider Klystron Development Program, Linac 2000, XX International Linac Conference.

A. Kransnykh et al, A Solid State Marx Type Modulator for driving a TWT.

Krasnykh, Analysis of Klystron Modulator Approaches for NLC, XX International Linac Conference, Monterey, CA Aug. 21-25, 2000.

Casey, et al, Solid-State Pulsed Power Systems for the Next Linear Collider, International Power Modulator Conference, Hollywood, CA, Jun. 30-Jul. 3, 2002.

C. Pappas, et al., "Damping Ring Kickers for the Next Linear Collider," Proceedings of the 1999 Particle Accelerator Conference, New York, pp. 1500-1502. (copy of PDF enclosed entitled "Article 1".).

* cited by examiner

HIGH VOLTAGE PULSED POWER SUPPLY USING SOLID STATE SWITCHES

CROSS-REFERENCE TO RELATED APPLICATIONS

Not Applicable.

BACKGROUND OF THE INVENTION

1. The Field of the Invention

The present invention relates to systems and methods for generating high voltage pulses. More particularly, the present invention relates to systems and methods for generating high voltage pulses controlled by solid state switches.

2. Background and Relevant Art

Many applications need a pulsed power supply that is able to deliver high voltage pulses. Spectrometers, accelerators, radar transmitters, high impedance electron guns, ion tubes, liquid polarizing cells, etc., are examples of applications that need high voltage pulses. In conventional systems, a pulsed power supply uses a high voltage pulse forming network and some sort of switch such as a spark gap or a thyratron.

These types of pulsed power supplies are often created using principles of Marx Generators. Generally, a Marx Generator is circuitry that generates a voltage pulse by charging a group of capacitors in parallel and then discharging the capacitors in series. FIG. 1 illustrates an example of a typical Marx Generator. In FIG. 1, a charging voltage 101 is applied to a pulse forming network 100. The stage capacitors 104 charge through the resistors 102 in a parallel fashion. The spark gaps 106 prevent the capacitors 104 from discharging into a load 108 until certain conditions are satisfied.

When the capacitors 104 are sufficiently charged, the lowest gap is typically allowed to break down or is triggered. When the lowest gap breaks down or triggers, two capacitors are effectively in series and the next gap breaks down. Very quickly, all of the gaps break down. The result of this process is that the capacitors 104 are connected in series and a voltage pulse is generated and delivered to the load 108. The capacitors 104 of a Marx Generator may also be charged using inductors or a series of transformers. In other example, the resistors 102 are replaced with inductors. The spark gaps can alternatively be replaced, for example, with switches such as thyratrons.

Because a Marx Generator is charged in parallel, the magnitude of the voltage pulse can be increased by adding additional charging sections. However, it has been found that the number of sections that can be stacked together is effectively limited by stray capacitance. As the number of sections in the pulse forming network increases, the stray capacitance to ground also increases. One of the effects of stray capacitance is that the current is diverted to ground. The stray capacitance also has an adverse affect on the rise time and/or fall times of the voltage pulse. The stray capacitance therefore limits the number of sections that can be included in the pulse generator.

The stray capacitance can also have an impact on the voltage that a particular section sees. In addition, the stray capacitance seen by one section is usually different from the stray capacitance seen by another section of the Marx Generator. Because the stray capacitance is not balanced across the sections of the pulse generator, some of the sections may experience higher voltages and may therefore malfunction. Although most systems are affected by stray capacitance, the inductors, resistors, transformers, and isolated supplied needed to charge the capacitors in the pulse generator also add stray capacitance to the pulse generator. In other words, the components of conventional pulse generators introduce additional stray capacitance to the system and further reduce the number of sections that can be successfully connected together.

Because Marx Generators are often used to generate high voltages, they can be quite large in both size and weight. In addition, a Marx Generator that generates hundreds of kilovolts should be using oil. Oil is typically necessary, but is often undesirable. Conventional pulsed power supplies or Marx Generators are often large and expensive, are limited by stray capacitance, and use components (such as thyratrons) that reduce their reliability.

BRIEF SUMMARY OF THE INVENTION

These and other limitations are overcome by embodiments of the present invention, which relates to systems and methods for generating a voltage pulse. In one embodiment of the invention, a series voltage cells with relatively low voltage requirements can be stacked together in series, each voltage cell including a capacitor connected in series with a switch (such as a solid state switch) that can be turned on and off. When multiple voltage cells are connected to form a pulse generator, the capacitors of the voltage cells are charged in parallel and discharged in series using one or more switches. Main switches are used at least to discharge the capacitors and return switches are used at least to charge the capacitors.

When the voltage cells are stacked, for example, the capacitors and main switches are connected in series. The capacitors are isolated from each other by the main switches which are turned off. When the main switches are on, the capacitors are connected in series and a voltage pulse is generated. When the main switches are off, the return switches may be turned on and provide a return path for the current that charges the capacitors in the voltage cells. Thus, the return switches are off when the main switches are on such that the capacitors discharge to the load. Advantageously, the capacitors can be charged without the use of inductors, resistors, or isolated supplies, thereby reducing some of the stray capacitance associated with conventional Marx Generators. In addition, the switches can be driven by use of an auxiliary supply without using inductors, resistors, isolated supplies, or step down supplies.

The capacitors in each voltage cell can be charged through a diode string supply line. A return path for the charging current is provided through return switches. When the capacitors are charging or are charged, main switches placed between successive capacitors are in an off state and prevent the capacitors from discharging in series. When the main switches are turned on, the capacitors are then connected in series and discharge. During discharge, the return switches are turned off. To recharge the capacitors, the main switches are turned off and the return switches are turned back on. The return switches can also be turned on during discharge to help, in one embodiment, decrease the fall time of the pulse by providing a path for the stray capacitance to discharge.

The voltage cells can also be configured to generate either a positive or a negative voltage pulse. In one embodiment, a bipolar pulse generator has a capacitor bank that includes a series of voltage cells configured to generate a positive pulse can be connected with a capacitor bank that includes a series of voltage cells configured to generate a negative pulse. This bipolar pulse generator can charge all of the capacitors in both sets of voltage cells at the same time. The switches in the respective capacitor banks can be controlled to discharge one set of capacitors to generate either the positive or the negative pulse. In addition voltage cells that are configured to charge in series can be added to provide droop control and control the shape of the generated voltage pulse.

Each voltage cell may also includes a balance network that balances the stray capacitance seen by that voltage cell. Because each voltage cell in a series of voltage cells "sees" a different stray capacitance, the balance networks can be adapted to match the stray capacitance seen by the voltage cells. This has the benefit of balancing the voltage seen by each cell.

The voltage cells can be used to adjust the voltage pulse by controlling which voltage cells are active. In other words, one or more of the voltage cells can be made inactive to alter the voltage pulse without affecting the ability to generate the voltage pulse. At the same time, the failure of a particular cell does not prevent the pulse generator from pulsing. Thus, embodiments of the present invention can control the amplitude of the voltage pulse, a duration or width of the voltage pulse, the rise and fall times of the voltage pulse, and the like or any combination thereof.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The present invention relates to systems and methods for generating a voltage pulse. Embodiments of the invention can control an amplitude of the voltage pulse, a duration or width of the voltage pulse, a rise time of the voltage pulse, a fall time of the voltage pulse, and the like or any combination thereof.

Embodiments of the invention include voltage cells that typically have both a capacitor and a switch in series. The first and last voltage cells in a series of voltage cells may be adapted to connect to the load. Return switches are also included in most voltage cells. The return switches provide a path for the charging current supplied through a diode chain or a diode chain supply line. Advantageously, the return switches eliminate the use of inductors, resistors, and isolated supplies prevalent in conventional pulse generators. The switch drives are also provided with energy through an auxiliary diode chain, thereby eliminating the need for inductors, resistors, isolated supplies, and step down supplies that would otherwise be needed to provide the auxiliary power to the switch drives. Also, the elimination of these components reduces the stray capacitance to ground associated with the systems and methods described herein, which enables more voltage cells or sections to be stacked in series.

Figure 1:
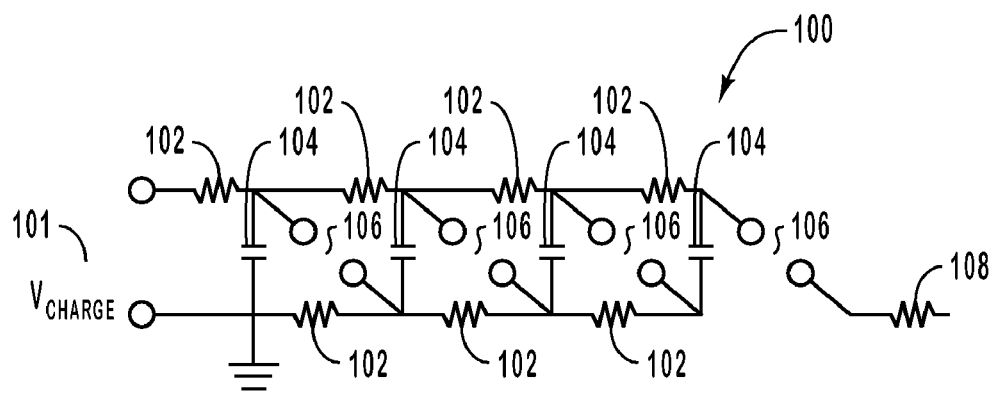
FIG. 1 illustrates an example of a Marx Generator that uses spark gaps to generate a voltage pulse.
Figure 2:
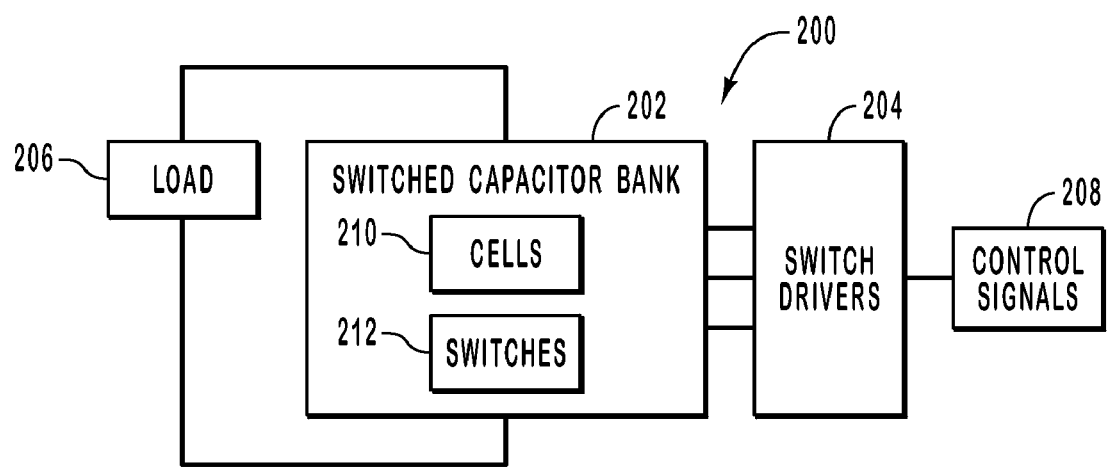
FIG. 2 illustrates one embodiment of a pulse generator that uses switches to control a series of voltage cells.

FIG. 2 illustrates a block diagram of one embodiment of a pulse generator or system for generating and delivering a high voltage pulse to a load. More particularly, the system 200 generates and delivers a high voltage pulse to the load 206. In the system 200, a switched capacitor bank 202 includes one or more capacitor or voltage cells 210 that are typically arranged in series. The voltage cells 210 are used to store the energy that is delivered to the load 206 as a voltage pulse.

The voltage cells 210 are typically associated with switches 212 that are controlled by the switch drivers 204. By controlling the control signals 208, the switch drivers 204 can turn the switches 212 on/off. The state of the switches 212, determines whether the voltage cells 210 are charging or discharging through the load 206. In one embodiment, the effects of stray capacitance are reduced such that more voltage cells can be connected in series. Because more voltage cells can be connected in series, a lower voltage source can be used to generate a larger voltage pulse. Also, the switch drivers can be rated for lower voltages. As a result, the cost and size of the pulse generator are typically reduced.

In one embodiment of the system 200, the voltage cells are charged in parallel and discharged in series by controlling the state of the switches 212. One of the advantages of the system 200 is that one or more of the voltage cells 210 can fail without preventing the system 200 from delivering a high voltage pulse to the load 206. The system 200 can be configured to deliver a positive voltage pulse, deliver a negative voltage pulse, or deliver either a positive or negative voltage pulse (bipolar output). In addition, the control signals 208 can be used to control a duration of the voltage pulse, a magnitude of the voltage pulse, a rise time of the voltage pulse, and the like or any combination thereof. The control signals may be optically coupled to the switch drivers 204 in one embodiment.

Figure 3A:
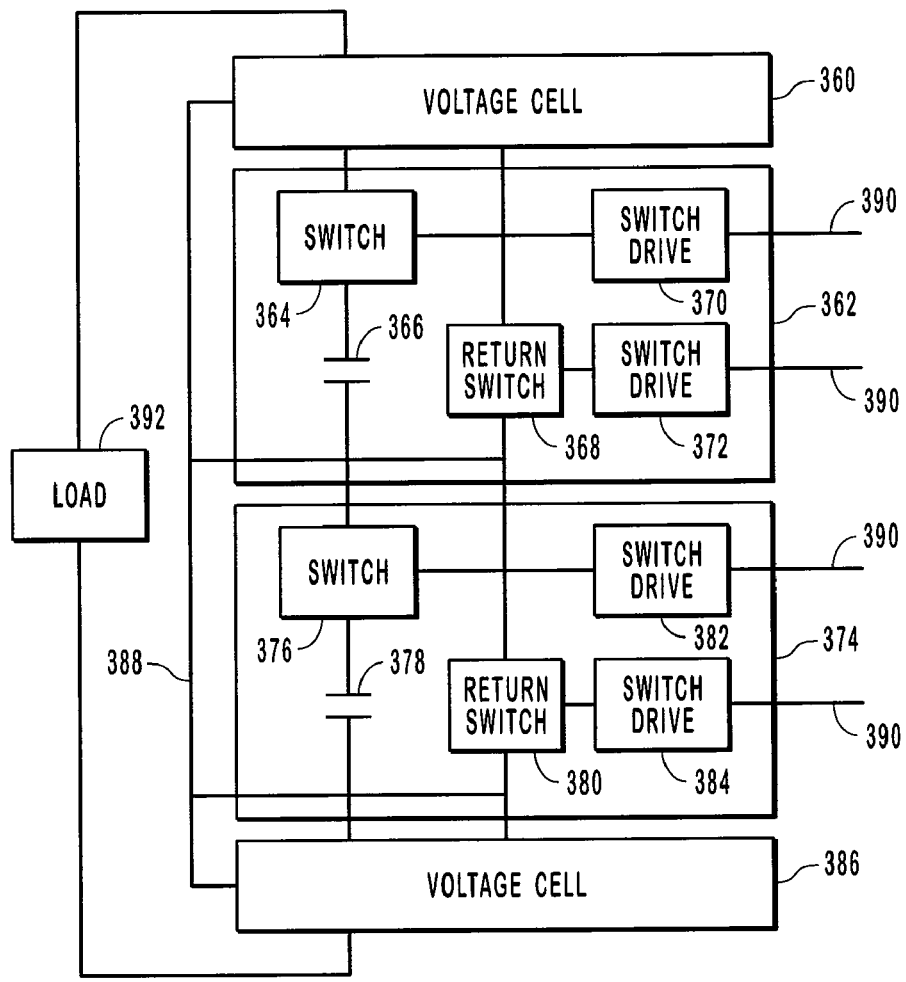
FIG. 3A illustrates a series of voltage cells and illustrates a main switch used to connect the capacitors in the voltage cells in series and return switches that provide a return path for a charging current.

FIG. 3A illustrates a diagram of one embodiment of a system for storing and/or delivering a high voltage pulse to a load. More particularly, FIG. 3A illustrates a few voltage cells connected in series, but one of skill in the art can appreciate the more or fewer voltage cells can be included. Each voltage cell is similarly configured and operate together to (i) charge the capacitors in parallel or independently of other voltage cells and (ii) discharge the capacitors in series.

For example, the voltage cell 362 includes, in this example, a capacitor 366 that is used to store a charge. At the same time, the capacitor 378 in the voltage cell 374 is also storing a charge. When storing a charge, the switches 364 and 376 (and similar switches in other voltage cells) are off. Thus, the capacitors 366 and 378 can charge in parallel or independently.

Figure 3C:
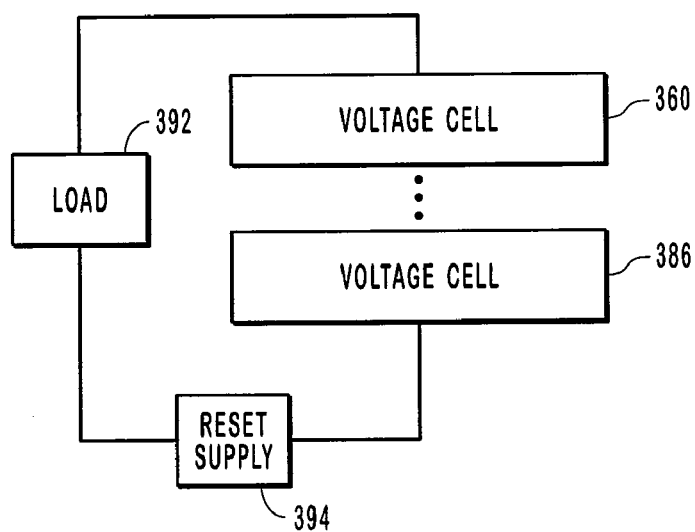
FIG. 3C illustrates another embodiment of a pulse generator with a reset supply included in series with the charging switch to provide a core reset current.
Figure 3B:
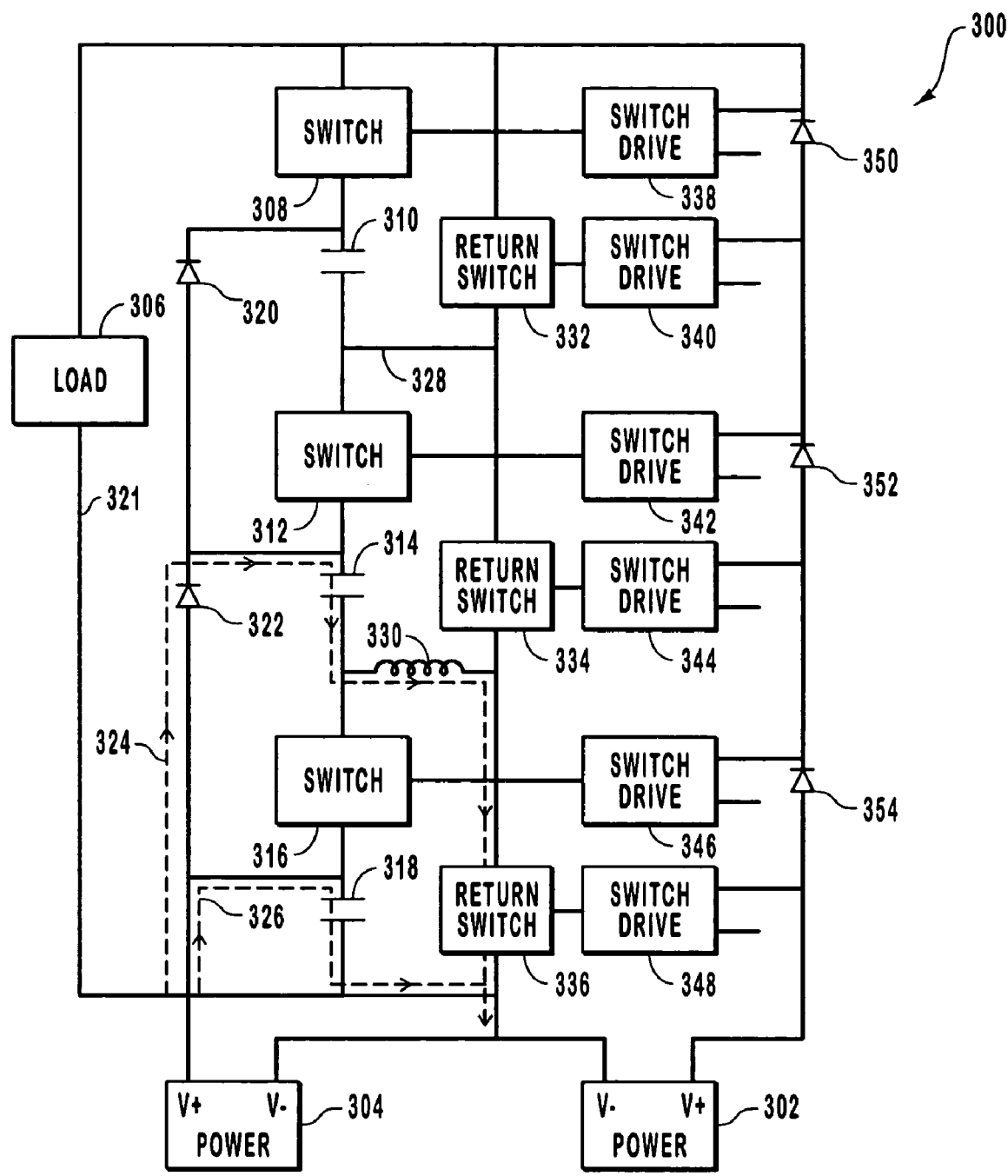
FIG. 3B is a more detailed diagram of one embodiment of a pulse generator and illustrates the path of the charging current for each voltage cell through a diode string supply and illustrates a diode string to provide auxiliary power to the switch drives.

The capacitors 366 and 378 are charged by the supply line 388 and because the switches 364 and 376 are off, the return switches 368 and 380 are turned on to provide a return path for the charging current provided through the supply line 388. As illustrated in FIG. 3B, the supply line 388 is a diode string and typically includes one or more diodes to separate the voltage cells. The switch drives 370 and 382 control the state of the switches 364 and 376, respectively. The switch drives 372 and 384 control the state of the return switches 368 and 380, respectively. The control lines 390 can be used to control the states of the switches 364, 376 and the states of the return switches 368, 380.

When the switches 364, 376 are turned on and the return switches 368, 380 are turned off, then the capacitors 366, 378 are connected and discharge in series to the load 392. In other words, connecting and discharging the capacitors 366, 378 in series generates a high voltage pulse that is applied to the load 392. Turning off the switches 364, 376 can terminate the pulse. Thus, the duration of the pulse can be controlled through controlling the switches 364, 376. If a particular voltage cell is non-functional, the supply line 388 is an example of the path that the current can follow during delivery of the pulse. In other words, a non-functional voltage cell does not prevent a pulse from being generated or delivered to the load 392.

FIG. 3B illustrates one embodiment of a high voltage pulse generator. This embodiment includes three voltage cells, but as previously stated, one of skill in the art can appreciate that more or fewer stages can be included. In this example, the capacitors 310, 314, and 318 store charge. Charge is stored by turning the switches 308, 312, and 316 to an off state.

When charging the capacitors 310, 314, and 318, the return switches 332, 334, and 336 are in an on state and the main switches 308, 312, and 316 are off. The path 326 illustrates a path of the current from the power supply 304 that charges the capacitor 318. At the same time, the power supply 304 delivers current through the path 324 to charge the capacitor 314. The path 324, after passing through the capacitor 314, proceeds through the return switch 336 via the connection 330. A similar path through the diode 320 and the return switches 334, and 336 is used to charge the capacitor 310. The current that charges the capacitor 310 proceeds through the connection 328 and then through the return switches 334 and 336. The diodes 320 and 322 isolate the power supply 304 from the pulse and ensure that the current flows to the load 306 during discharge. At the same time, the diodes permit the pulse to pass around any voltage cell that is not functioning.

During discharge of the capacitors, the switches 308, 312, and 316 are turned on using the control signals provided to the switch drives 338, 342, and 346, respectively. At the same time, the control signals are delivered to the switch drives 340, 344, and 348 to turn the return switches 332, 334, and 336 off. When the return switches 332, 334, and 336 are turned off, the discharge current does not flow through the return switches and is delivered to the load 306.

As illustrated in FIG. 3B, the connection 328 is shown as a wire or short while the connection 330 is illustrated as an inductor. Typically, all of the connections in the voltage cells are the same, but two types of connections are illustrated in this example to describe additional embodiments of the invention. When the connection is an inductor like the connection 330, the timing between turning the switch 316 on and the return switches off can be delayed. An inductive connection 330 can increase the rise time of the leading edge of the pulse.

For example, when the switches 308, 312, and 316 are turned on and the return switches 332, 334, and 336 are also on, a current begins to build in the inductive connections like the connection 330. After allowing the inductance to build, the return switches 332, 334, and 336 can be turned off. There is thus a delay in turning the switches 308, 312, and 316 off and turning the return switches 332, 334, and 336 on. The energy stored in the inductive connection 330 is then added to the energy being discharged from the capacitors 210, 314, and 318. Combining the inductive energy of the inductive connection 330 with the capacitive energy stored in the capacitors 310, 314, and 318 results in a faster rise time of the voltage pulse. One of skill in the art, however, can appreciate that an inductive connection does not require a delay to be incorporated between turning the switches 308, 312, and 316 to an on state and turning the return switches 332, 334, and 336 to an off state.

When the pulse generator is ready to terminate the high voltage pulse, the switches 308, 312, and 316 are typically turned off. The fall time of the high voltage pulse can be improved by turning on the return switches 332, 334, and 336. Opening the path through the return switches can help discharge stray capacitance and/or load capacitance, which improves the fall time of the high voltage pulse.

Figure 4:
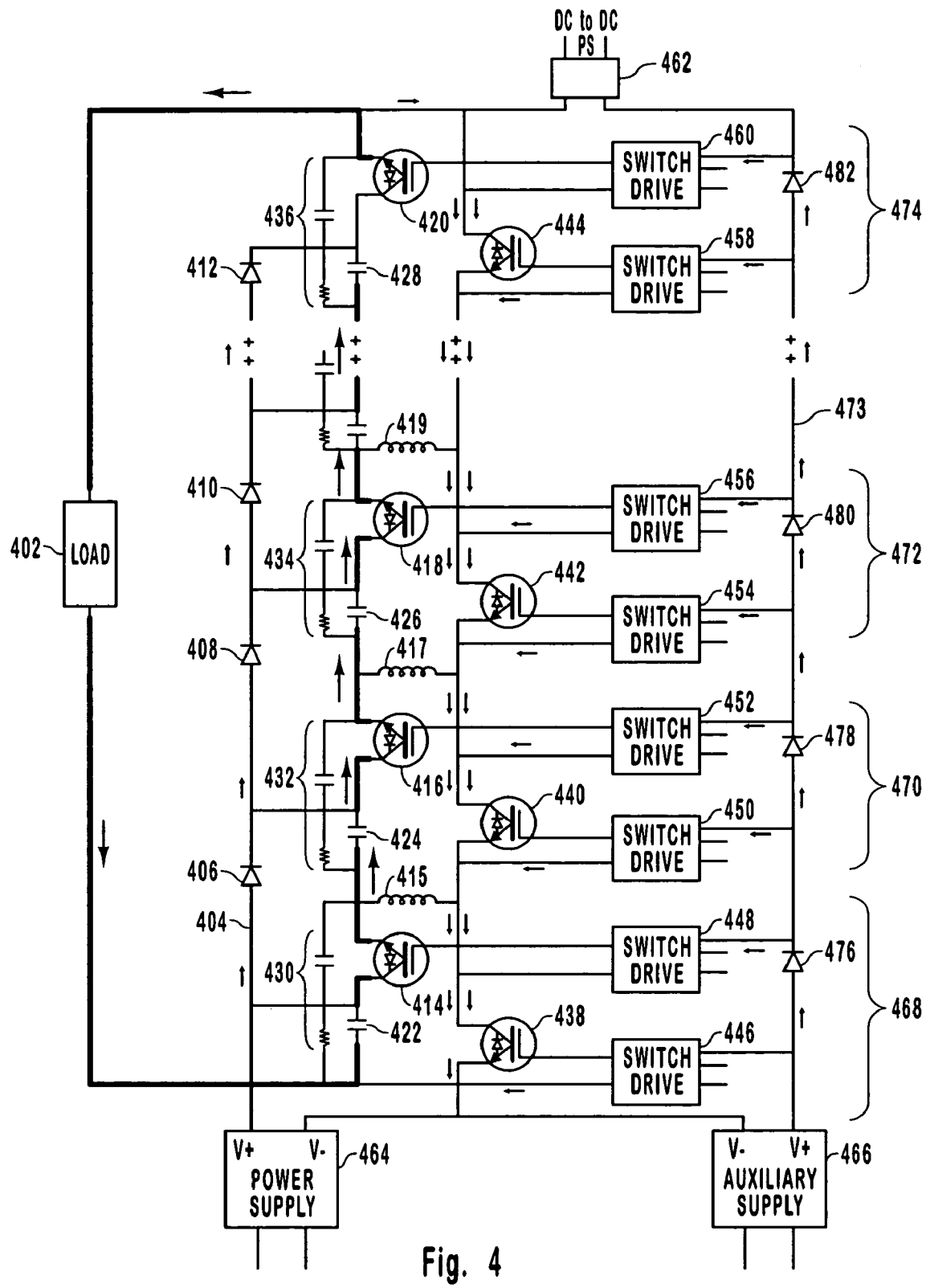
FIG. 4 illustrates one embodiment of a series of voltage cells arranged to generate a positive voltage pulse.

FIG. 4 illustrates a block diagram of a pulse generator that includes multiple voltage cells (also referred to herein as stages or sections). The example of the pulse generator illustrated in FIG. 4 generates a positive voltage pulse. FIG. 4 illustrates the voltage cells 474, 472, 470, and 468 that are connected as previously described using main switches 414, 416, 418, and 420 controlled by switch drives 448, 452, 456, and 460, and return switches 438, 440, 442, and 444 controlled by switch drives 446, 450, 454, and 458. In this example, the return path from the supply line 404 includes inductive connections 415, 417, and 419 from the charging capacitors 422, 424, 426, and 426 through the return switches.

FIG. 4 further illustrates an auxiliary path 473 that is used by the power supply 466 to provide power to the switch drives 446, 448, 450, 452, 454, 456, 458, and 460 (446–460). The auxiliary path 472 includes the auxiliary diodes 476, 478, 480, and 482 (476–482). The auxiliary diodes 476–482 help isolate the power supply 466 and help deliver pulse to the load 402.

The auxiliary diode string that includes the auxiliary diodes 476–482 represent a voltage drop for each diode in the diode string. Thus, the voltage available at a particular stage is affected by the forward voltage drops of the diodes in the diode string. The voltage provided by the auxiliary power 466 simply provides sufficient voltage to overcome the forward voltage drops of the diodes and/or the charging switch voltage drops. If a large number of voltage cells are included, boosting voltage supplies may be included to provide adequate voltage levels.

The switch drives or switches 446–460, in one embodiment, can be any type of solid state switches known in the art. Bipolar junction transistors, field effect transistors, IGBTs, Darlington Bipolar transistor, solid state switches, and the like are examples of switches that can be used as described herein. Each voltage cell includes a switch drive for a main switch and a switch drive for a return switch. For example, the voltage cell 468 includes a switch drive 448 used to control the main switch 414. In this example, the gate of the main switch 414 is controlled by the switch drive 448. The switch drive 446 controls a state of the return switch 438.

The voltage available to the switch drives 446–460 is often reduced at successive switch drives by the voltage drop across previous diodes in the diode string and switches. Each switch drive can be driven from either ground or from the previous voltage cell. In one embodiment, DC-DC converters may be used to provide adequate voltage. In another embodiment, the switch drives are optically coupled from ground.

The energy storage capacitors 422, 424, 426, and 428 are charged by way of the diodes 406, 408, 410, and 412 and the return switches. Charging the capacitors in this manner eliminates the use of inductors, resistors, or isolated supplies that are common in conventional Marx Generators. In addition, the energy needed to drive the switches can also be provided through the diode string in the auxiliary path 473, eliminating the use of inductors, resistors, or isolated supplies or step down supplies that may otherwise be needed. The switches can be triggered by way of example, fiber optic coupling, transformer coupling, or by the auxiliary power diodes.

The diode string that includes the diodes 406, 408, 410, and 412 provides several advantages. First, the diode string isolates each voltage cell or voltage stage from other voltage cells or stages during the pulse. The diode string also an alternate current path around a particular voltage cell or stage of the switch for that particular voltage cell is not turned on or is delayed. The diode string enables a voltage pulse to be delivered even though a voltage cell is delayed or fails.

FIG. 4 further illustrates balance networks 430, 432, 434, and 436. Each balance network typically includes a capacitor in series with a resistor and each balance network helps balance the stray capacitance to ground. The capacitance in the balance networks helps to equally distribute the voltages from section to section during the rise time and the fall time of the voltage pulse. Because the stray capacitance to ground associated with a particular voltage-cell is typically different from the stray capacitance to ground associated with other voltage cells of the pulse transformer, the capacitance and/or resistance of each voltage cell can be adapted to match the stray capacitance "seen" by that voltage cell. Thus the capacitance of the balance network 430 may be different from the capacitance of the balance networks 432, 434, and 436. The capacitance of each balance network is selected to match the stray capacitance. The resistance in each balance network helps reduce ringing of the stray inductance and/or the stray capacitance.

The power supply 462 can provide a source of power at the high voltage end of the load 402. For example, if the load 402 is a pulsed tube, then the power supply 462 can provide power for the filament or heater of the pulsed tube. Thus power supply 462 provides a power source at the high voltage end without additional equipment.

Figure 5:
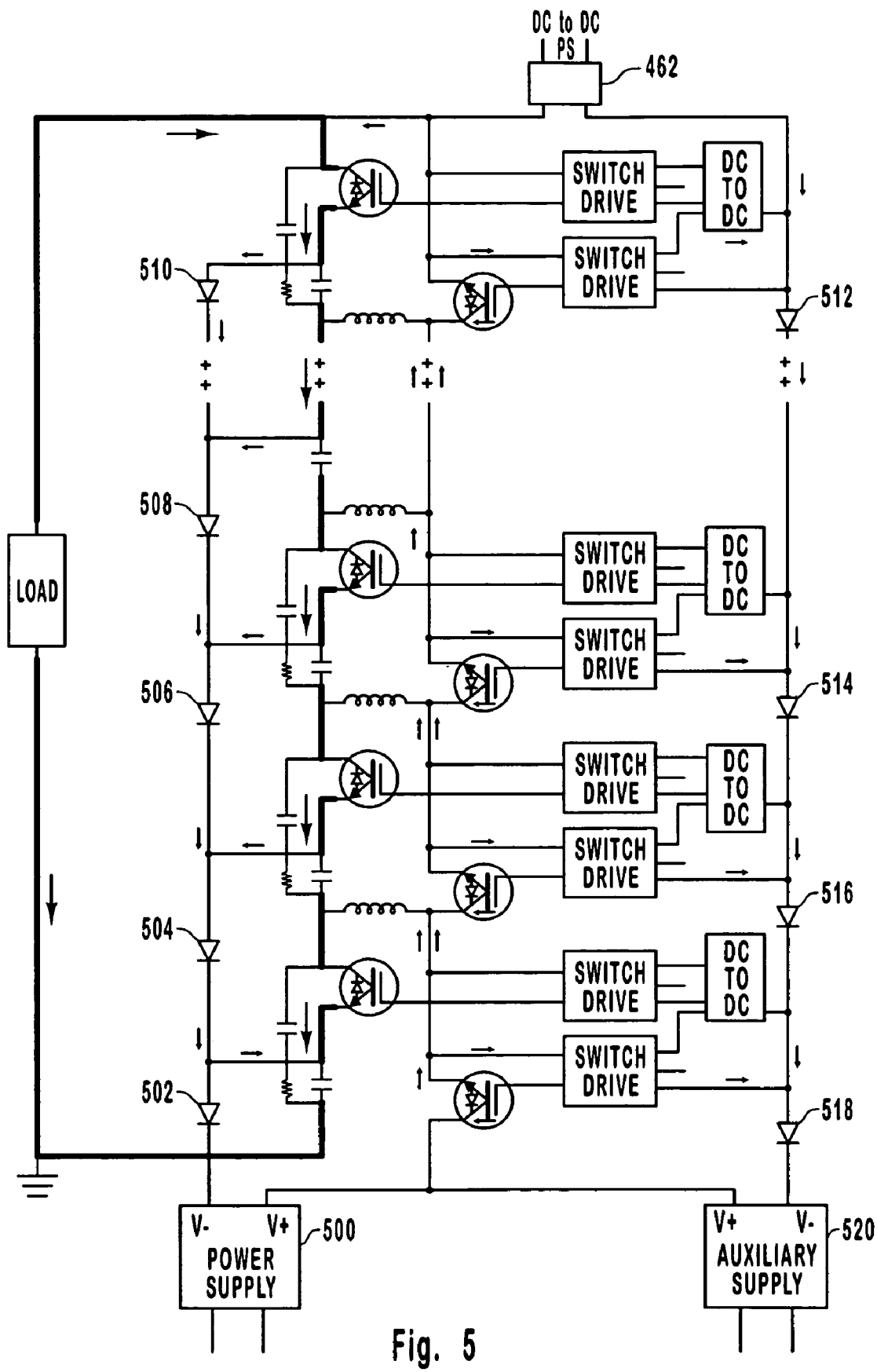
FIG. 5 illustrates one embodiment of a series of voltage cells arranged to generate a negative voltage pulse.

FIG. 5 illustrates another embodiment of a pulse generator. FIG. 5 is similar to the pulse generator illustrated in FIG. 4, with the difference that the pulse generator in FIG. 5 generates a negative voltage pulse whereas the pulse generator of FIG. 4 generates a positive pulse. The charging diodes 502, 504, 506, 508, and 510 and the auxiliary diodes 512, 514, 516, and 518 are configured to accommodate a negative power supply 500, 520. The switches and the return switches are also adapted to a negative supply.

Figure 6:
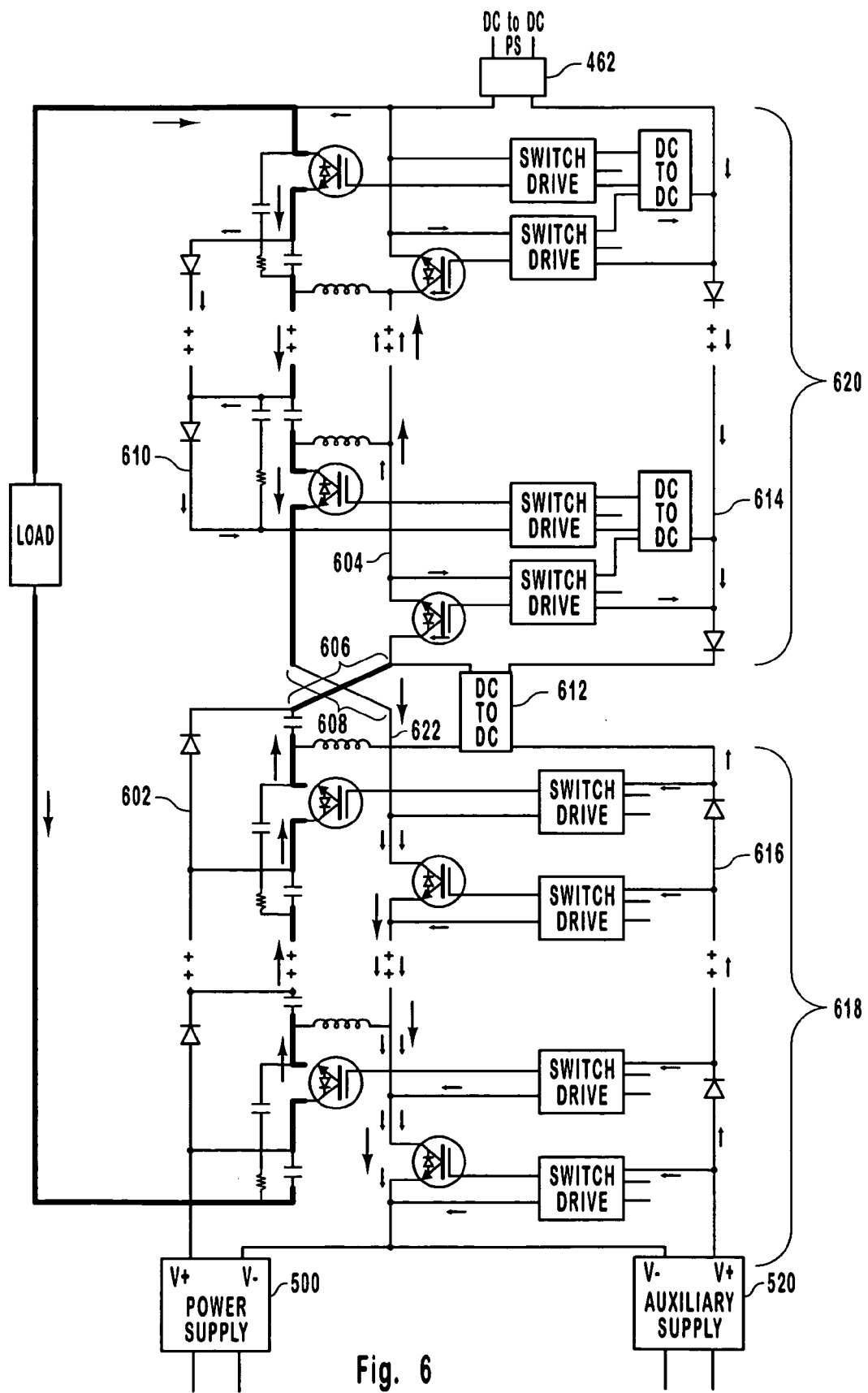
FIG. 6 illustrates an embodiment of a pulse generator that can generate both positive and negative pulses.

FIG. 6 illustrates an embodiment of a pulse generator that has a bipolar output. In other words, the pulse generator 600 illustrated in FIG. 6 can generate both positive and negative type voltage pulses. The bipolar pulses can be generated by stacking voltage cells configured to generate a positive voltage pulse in series with voltage cells configured to generate a negative voltage pulse.

In FIG. 6 the positive voltage cells 618 generate a positive type voltage pulse and the negative voltage cells 620 generate a negative type voltage pulse. The voltage cells 618 are in series with the voltage cells 620. In this example, the diode string 602, which is used to charge the capacitors in the voltage cells 618, is connected with the return line switch string 604 of the voltage cells 620 via the connection 606. Similarly, the diode string 610, which is used to charge the capacitors in the voltage cells 620, is connected in series with the return line switch string 622 of the voltage cells 618 via the connection 608. The negative supply auxiliary diode string 614 is connected with the positive supply auxiliary diode string 616 using an inverting DC-DC supply 612. All of the capacitors in the positive voltage cells 618 and the negative voltage cells 620 can be charged at the same time.

Figure 7:
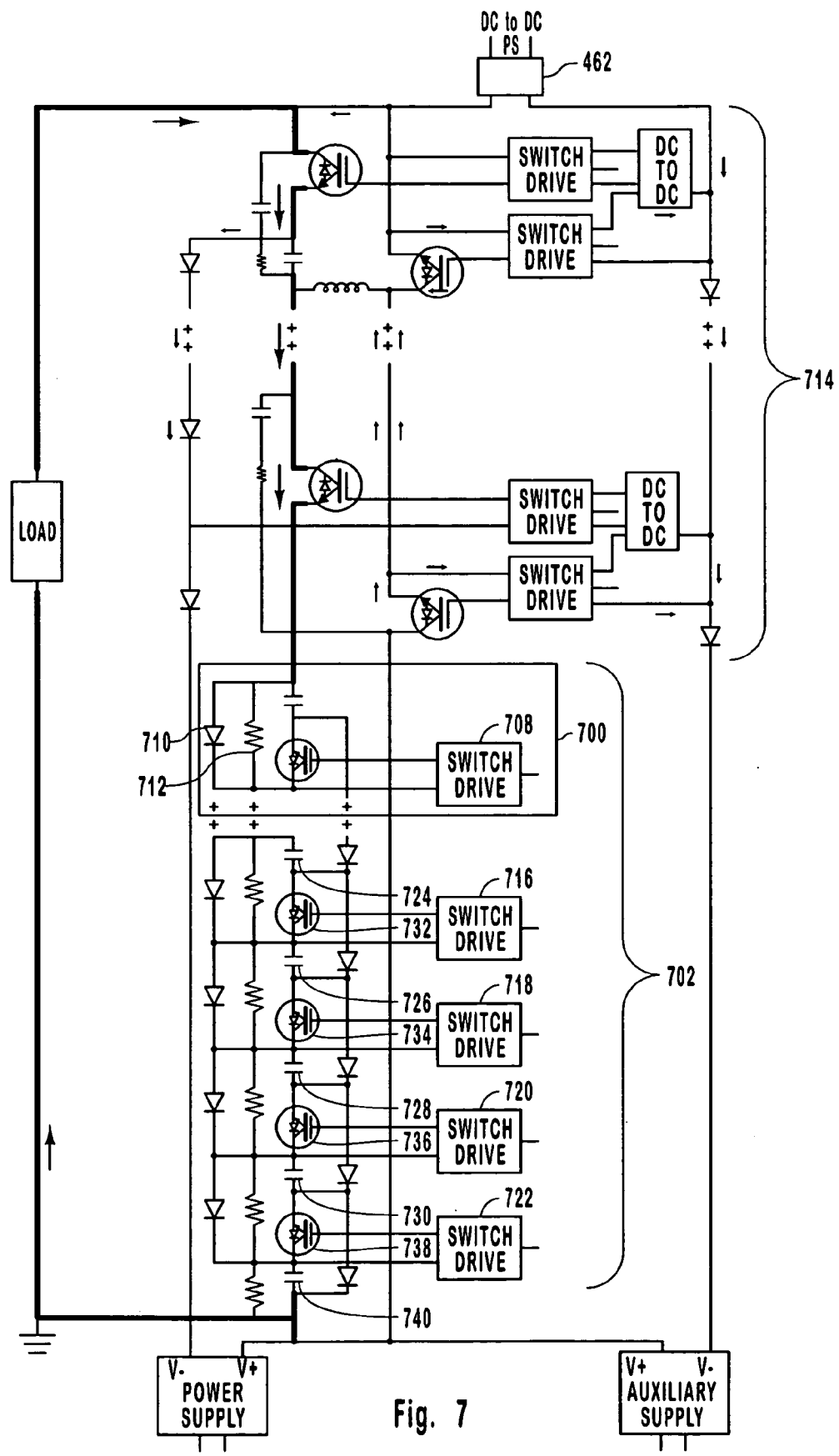
FIG. 7 illustrates another embodiment of a pulse generator that includes voltage cells arranged to provide droop control for the voltage pulse.

FIG. 7 illustrates an embodiment of a pulse generator that includes droop correction. More particularly, FIG. 7 illustrates droop correction for a negative type pulse generator. The embodiment of the pulse generator illustrated in FIG. 7 includes a plurality of voltage cells 714 as previously described. In this example, the voltage cells 714 are connected with a series of cells 702 that are different from the voltage cells 714.

In this example, the voltage cells 702 are configured such that they charge in series and discharge in parallel. The switch drives 708, 716, 718, 720, and 722, control the switches 706, 732, 734, 736, and 738 such that the capacitors 704, 724, 726, 728, 730, and 740 charge in series. At the same time, the storage capacitors of the voltage cells 714 are charging in parallel. However, the voltage cells 702 are configured to provide droop correction.

When the switches in the voltage cells 702 are on, the capacitors charge in series. During the voltage pulse, the voltage cells 702 can be discharged such that the shape of the voltage pulse can be adjusted. In one embodiment, the droop can be corrected across the entire pulse by controlling or delaying the discharge of the capacitors in the voltage cells 702.

In another embodiment of the invention, the pulse may drive a pulse transformer with a core that needs to be reset. A reset supply, such as the reset supply 394 illustrated in FIG. 3C, could be included in series with the ground end of the charging switch to provide the core reset current. This eliminates the need to have a core reset inductor.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A pulse generator that generates a voltage pulse that is applied to a load, the pulse generator comprising:
   a plurality of voltage cells connected in series, each voltage cell comprising:
      a main switch;
      a capacitor connected in series with the main switch, wherein the capacitor is also connected in series with other capacitors and with other main switches in the a plurality of voltage cells when the main switches in the plurality of voltage cells are on such that a voltage pulse is delivered directly to a load by the series of capacitors, and wherein the capacitor is isolated from the other capacitors in the plurality of voltage cells when the main switch is turned off, and
      a return switch that provides a return path for a charging current that charges the capacitor when the main switch is off and the return switch is on;
   a first switch drive to control the main switch;
   a second switch drive to control the return switch;
   a first diode string connected with each of the a plurality of voltage cells, wherein the charging current is supplied to each capacitor in each voltage cell through the diode string;
   a second diode string connected with the first switch drive and the second switch drive of each voltage cell; and
   an auxiliary power supply connected to the second diode string to provide power to the first and second switch drives.

2. A pulse generator as defined in claim 1, further comprising an inductive connection from the capacitor to the return switch.

3. A pulse generator as defined in claim 2, wherein controlling a turn off time of the return switch relative to a turn of the main switch decreases a rise time of a voltage pulse by storing inductive energy in the inductive connection.

4. A pulse generator as defined in claim 1, wherein the diode string, the main switch and the return switch are configured to generate one of a negative type voltage pulse, a positive type voltage pulse, and a bipolar type voltage pulse.

5. A pulse generator as defined in claim 1, further comprising a reset supply in series with the return switch, wherein the reset supply provides a reset current to the load.

6. A pulse generator as defined in claim 1, further comprising one or more additional voltage cells having additional capacitors that charge in series, wherein additional switches control a discharge of the additional capacitors to adjust a droop of the voltage pulse.

7. A pulse generator for generating a voltage pulse that is applied to a load, the pulse generator comprising:
   a first capacitor bank including:
      a plurality of main switches; and
      a plurality of capacitors connected with the plurality of main switches such that each main switch is followed by a capacitor, wherein the plurality of capacitors are connected in series with the plurality of main switches when the plurality of main switches are all on;
   a diode string supply connected with the first capacitor bank, wherein a charging current is provided to the plurality of capacitors through the diode string;
   a plurality of return switches connected with the first capacitor bank, wherein the plurality of return switches provide a return path for the charging current when the plurality of return switches are turned on;
   a plurality of inductive connections that connect the plurality of return switches with the capacitor bank, the plurality of inductive connections configured to affect a rise time of a voltage pulse; and
   a plurality of main switch drives that turn the plurality of main switches on to discharge the plurality of capacitors and that turn the plurality of main switches off when charging the plurality of capacitors through the diode string supply.

8. A pulse generator as defined in claim 7, wherein the plurality of return switch drives:
   turn the plurality of return switches on to provide a return path for the charging current; and
   turn the plurality of return switch drives off when the plurality of main switches are turned on.

9. A pulse generator as defined in claim 8, further comprising an auxiliary diode string supply to provide power to the plurality of main switch drives and to the plurality of return switch drives.

10. A pulse generator as defined in claim 7, wherein a turn off time of the plurality of return switches is delayed with respect to a turn on time of the plurality of main switches such that an inductive energy can build in the inductive connections to decrease the rise time of the voltage pulse.

11. A pulse generator as defined in claim 10, wherein the plurality of return switches are turned on before the plurality of main switches are turned off to decrease a fall time of the voltage pulse.

12. A pulse generator as defined in claim 11, further comprising a second capacitor bank, wherein a plurality of main switches of the second capacitor bank and a plurality of return switches of the second capacitor bank are inverted such that a second set of voltage cells in the second capacitor bank deliver a negative type pulse.

13. A pulse generator as defined in claim 12, wherein the plurality of capacitors of the first capacitor bank and plurality of capacitors of the second capacitor bank charge at the same time from a power supply.

14. A pulse generator as defined in claim 13, wherein the diode string is connected with the plurality of return switches that are connected with the second capacitor bank and wherein a second diode string for delivering the charging current to the plurality of capacitors of the second capacitor bank are connected with the plurality of return switches connected to the first capacitor bank.

15. A pulse generator as defined in claim 7, wherein a second auxiliary diode chain connects with a first auxiliary diode chain through an inverting DC to DC power supply.

16. A voltage cell that can be connected in series with other voltage cells to form a pulse generator that generates a voltage pulse, the voltage cell comprising:
   a main switch configured to connect in series with another capacitor of another voltage cell;
   a capacitor in series with the main switch and configured to connect in series with another main switch of another voltage cell;

a main switch drive configured to turn the main switch on and off, wherein the capacitor is connected in series with capacitors of the other voltage cells and with main switches of the other voltage cells such that the capacitor discharges in series with the other capacitors of the other voltage cells when the main switch driver turns the main switch on;

a balance network connected across the main switch and the capacitor, the balance network configured to match a stray capacitance seen by the voltage cell;

a return switch configured to connect in series with return switches of other voltage cells;

a return switch drive configured to turn the return switch on and off, and a connection between the capacitor and the return switch, wherein the connection provides a path for a charging current used to charge the capacitor, wherein a charging current charges the capacitor when the return switch is on and the main switch is off.

17. A voltage cell as defined in claim 16, wherein the connection between the capacitor and the return switch is a short connection.

18. A voltage cell as defined in claim 16, wherein the connection between the capacitor and the return switch is an inductive connection.

19. A voltage cell as defined in claim 16, wherein the main switch is one of a FET, a BJT, and an IGBT, and wherein the return switch is a same type of switch as the main switch.

20. A voltage cell as defined in claim 16, further comprising a diode connected to the main switch and the capacitor, wherein the charging current is received through the diode and charges the capacitor.

21. A voltage cell as defined in claim 16, wherein the balance network comprises a balance capacitor in series with a resistor, and the resistor selected to reduce ringing in the voltage pulse.

22. A voltage cell as defined in claim 16, wherein control signals are received by the main switch drive and the return switch drive, wherein the control signals cause the main switch to turn on and off and the return switch to turn on and off.

23. A voltage cell as defined in claim 22, wherein a rise time of a voltage is controlled by turning the return switch off by a delay after the main switch is turned such that an inductive energy builds in the connection between the capacitor and the return switch, wherein the inductive energy is used to increase a rise time of the voltage pulse when the return switch is turned off.

24. A voltage cell as defined in claim 22, wherein the return switch is turned on at an end of the voltage pulse to discharge a stray capacitance of a load and increase a fall time of the voltage pulse.

25. A voltage cell as defined in claim 9, wherein the voltage cell is connected with other voltage cells, and wherein the voltage cell is deactivated to decrease an amplitude of the voltage pulse.

26. A pulse generator that generates a voltage pulse that is applied to a load, the pulse generator comprising:

a plurality of voltage cells connected in series, each voltage cell comprising:
  a main switch;
  a capacitor connected in series with the main switch, wherein the capacitor is also connected in series with other capacitors in the a plurality of voltage cells when the main switches in the plurality of voltage cells are on such that a voltage pulse is delivered directly to a load by the series of capacitors without using a transformer; and
  a return switch that provides a return path for a charging current that charges the capacitor when the main switch is off and the return switch is on;

a diode string connected with each of a plurality of voltage cells, wherein the charging current is supplied to each capacitor in each voltage cell through the diode string; and one or more additional voltage cells having additional capacitors that charge in series and discharge in parallel, wherein additional switches control a discharge of the additional capacitors to adjust a droop of the voltage pulse by controlling timing of the discharge of the capacitors in the one or more additional voltage cells.

* * * * *

UNITED STATES PATENT AND TRADEMARK OFFICE
CERTIFICATE OF CORRECTION

| | | |
|---|---|---|
| PATENT NO. | : 7,301,250 B2 | Page 1 of 1 |
| APPLICATION NO. | : 10/838600 | |
| DATED | : November 27, 2007 | |
| INVENTOR(S) | : Richard L. Cassel | |

It is certified that error appears in the above-identified patent and that said Letters Patent is hereby corrected as shown below:

Column 4
Lines 47-48, change "By controlling the control signals 208, the switch drivers 204" to --By controlling the switch drivers 204, the control signals 208--

Column 6
Line 57, before "through", change "426" to --428--
Line 62, after "auxiliary path", change "472" to --473--

Signed and Sealed this

Fourteenth Day of April, 2009

JOHN DOLL
*Acting Director of the United States Patent and Trademark Office*